(12) United States Patent
Gao et al.

(10) Patent No.: US 8,228,431 B2
(45) Date of Patent: Jul. 24, 2012

(54) DIGITAL PHASE LOCK LOOP CONFIGURABLE AS A FREQUENCY ESTIMATOR

(75) Inventors: Li Gao, Austin, TX (US); Alan Hendrickson, Rollingwood, TX (US)

(73) Assignee: Silicon Laboratories Inc., Austin, TX (US)

( * ) Notice: Subject to any disclaimer, the term of this patent is extended or adjusted under 35 U.S.C. 154(b) by 409 days.

(21) Appl. No.: 12/551,146

(22) Filed: Aug. 31, 2009

(65) Prior Publication Data

US 2011/0050998 A1    Mar. 3, 2011

(51) Int. Cl.
- *H03L 7/00* (2006.01)
- *H04N 5/44* (2011.01)
- *H04N 5/50* (2006.01)
- *H03D 3/24* (2006.01)
- *H03D 3/18* (2006.01)
- *H04B 1/18* (2006.01)

(52) U.S. Cl. ........ 348/536; 348/725; 348/731; 375/327; 455/180.3

(58) Field of Classification Search .......... 348/536, 348/725, 731
See application file for complete search history.

(56) References Cited

U.S. PATENT DOCUMENTS

| | | | |
|---|---|---|---|
| 6,249,180 B1 * | 6/2001 | Maalej et al. | 329/304 |
| 6,324,228 B1 * | 11/2001 | Millward et al. | 375/344 |
| 6,426,972 B1 * | 7/2002 | Endres et al. | 375/229 |
| 6,741,645 B2 * | 5/2004 | Tan et al. | 375/233 |
| 6,907,089 B2 * | 6/2005 | Jensen et al. | 375/324 |
| 7,031,405 B1 * | 4/2006 | Touzni et al. | 375/326 |
| 7,265,792 B2 | 9/2007 | Favrat et al. | |
| 7,369,633 B2 * | 5/2008 | Jiang et al. | 375/354 |
| 7,369,835 B2 | 5/2008 | Margairaz et al. | |
| 7,894,333 B2 * | 2/2011 | Belotserkovsky | 370/216 |
| 8,005,447 B2 * | 8/2011 | Rodal | 455/180.3 |
| 2002/0067778 A1 * | 6/2002 | Ahn | 375/326 |
| 2003/0022651 A1 * | 1/2003 | Bannasch et al. | 455/307 |
| 2003/0133522 A1 * | 7/2003 | Staszewski et al. | 375/345 |
| 2005/0265486 A1 | 12/2005 | Crawley | |
| 2006/0222115 A1 | 10/2006 | Dornbusch et al. | |
| 2007/0189195 A1 * | 8/2007 | Belotserkovsky | 370/315 |
| 2008/0024230 A1 * | 1/2008 | Pera et al. | 331/16 |
| 2008/0074208 A1 * | 3/2008 | Lee | 332/127 |
| 2009/0129514 A1 * | 5/2009 | Twitto | 375/341 |

(Continued)

FOREIGN PATENT DOCUMENTS

WO    WO 03/067877    8/2003

OTHER PUBLICATIONS

Micronas, "DRX 3960A Digital Receiver Front-End," Feb. 8, 2001, pp. 1-30.

(Continued)

*Primary Examiner* — Brian Yenke
(74) *Attorney, Agent, or Firm* — Trop, Pruner & Hu, P.C.

(57) ABSTRACT

In various implementations, a re-configurable phase lock loop may have multiple signal paths, including a feedforward path to operate in a carrier frequency acquisition mode to obtain a carrier frequency estimate and a feedback loop path to operate in a carrier frequency tracking mode to translate an incoming signal to a baseband signal. The multiple signal paths may share most of the hardware to reduce implementation cost.

18 Claims, 7 Drawing Sheets

U.S. PATENT DOCUMENTS

2009/0213275 A1  8/2009  Trager
2010/0067619 A1* 3/2010  Furman et al. ............... 375/326
2011/0002425 A1* 1/2011  Gong ............................ 375/344

OTHER PUBLICATIONS

NXP, "TDA 8295 Digital Global Standard Low IF Demodulator for Analog TV and FM Radio," Feb. 4, 2008, pp. 1-77.

Xceive, "Welcome to Xceiver at CES 2007, Upgrade Your Tuner! Get XC5000," 2007, pp. 1-28.

Xceive, "XC5000 Product Brief," Dec. 2006, pp. 1-2.

U.S. Appl. No. 12/323,040, filed Nov. 25, 2008, entitled "Low-Cost Receiver Using Automatic Gain Control," by Ramin K. Poorfard, et al.

U.S. Appl. No. 12/493,955, filed Jun. 29, 2009, entitled "Digital Signal Processor (DSP) Architecture for a Hybrid Television Tuner," by Alan Hendrickson, et al.

* cited by examiner

DIGITAL PHASE LOCK LOOP CONFIGURABLE AS A FREQUENCY ESTIMATOR

BACKGROUND

In some radio frequency (RF) communication receivers, wide acquisition range is required due to uncertainty as to the RF carrier frequency. One example is a television (TV) receiver, where an acquisition range of up to 2 megahertz (MHz) is required. The assumption is that knowledge about existing TV channels frequency is not accurate at a television due to a great variety of transmission standards and frequency spectrum allocation plans around the world, as well as possible transmission frequency offsets at various local areas. Typically, receivers need to conduct two tasks, namely, channel acquisition and carrier tracking. The channel acquisition task operates with a wide acquisition range and the carrier tracking task operates with a relatively narrow tracking range. Typically, different circuitry is used to perform these two different tasks, leading to an increase in costs, and in semiconductor-based solutions an increase in die area.

Once a channel frequency is acquired through wideband acquisition, it can be tracked using a phase lock loop (PLL). Most PLLs have a relatively small operating range, e.g., usually tens of kilohertz (kHz) for loop stability and noise performance. Since there is typically insufficient frequency information available when a channel is selected, the frequency acquisition mode attempts to perform a coarse estimate of the carrier frequency so that once this estimate is known, it can be used to align the PLL to lock.

SUMMARY OF THE INVENTION

According to one aspect, the present invention includes a phase lock loop (PLL) to receive an incoming signal and to translate it to a baseband signal. The PLL may have multiple path configurations to support multiple tasks, including a feedforward configuration to operate in a wideband carrier frequency acquisition mode to obtain a carrier frequency estimate and a feedback loop configuration to operate in a narrowband carrier frequency tracking mode to translate the incoming signal to the baseband signal. In some implementations, the PLL is re-configured under control of the controller to operate first in feedforward configuration for the carrier frequency acquisition task to obtain a carrier frequency estimate and provide it to a controller and then reconfigured to feedback loop configuration for the carrier frequency tracking task.

In one implementation, the feedforward signal path includes a delay element to receive the incoming signal and to output a delayed sample, a conjugate function to generate a conjugate of the delayed sample, a multiplier to generate a correlation between the incoming signal and the delayed sample conjugate, a first filter to filter the correlation, a phase calculation engine to generate a phase value from the filtered correlation, and a second filter to filter the phase value to obtain the carrier frequency estimate. In turn, the feedback signal path includes the multiplier to multiply the incoming signal and a feedback sine/cosine pair to obtain the baseband signal, a third filter to filter the baseband signal, the phase calculation engine to generate an amplitude value and a phase value from the filtered baseband signal, a control logic to determine whether to re-map the phase value based on the amplitude value, a loop filter to filter the phase value, and a numerical controlled oscillator (NCO) to generate the sine/cosine pair based on the loop filter output. Two operating modes implement the two different signal paths required to perform the two tasks mentioned above sharing the same multiplier and phase calculation engine, reducing implementation hardware cost.

Another aspect of the present invention is directed to a television tuner having an analog front end to receive and downconvert a radio frequency (RF) signal to an intermediate frequency (IF) signal, and an analog-to-digital converter (ADC) to convert an analog signal into a digital signal, and a digital signal processor (DSP) coupled to the analog front end. The DSP may include a digital front end and a demodulator. The digital front end can perform a set of functions on the digital signal including frequency translation from the IF signal to a zero intermediate frequency (ZIF) signal. The demodulator may have a PLL to translate the ZIF signal to a baseband signal, the PLL including a feedforward configuration to operate in a carrier frequency acquisition mode and a feedback loop configuration to operate in a carrier frequency tracking mode to translate the ZIF signal to the baseband signal and including a control logic to allow operation in the existence of overmodulation. A controller may be coupled to the DSP to configure the PLL to operate in the carrier frequency acquisition and carrier frequency tracking modes.

Yet another aspect of the present invention is directed to a method for processing a request in a receiver to tune to an assigned channel, configuring a re-configurable PLL to operate in a frequency estimation mode, obtaining a frequency estimate of the carrier frequency, providing the frequency estimate to a controller, determining a difference between the frequency estimate and a predicted frequency for the assigned channel, and controlling an analog front end or a digital portion of a receiver for a frequency shift based on the frequency difference.

DETAILED DESCRIPTION

In various embodiments, a re-configurable phase lock loop (PLL) architecture can be used in a radio frequency (RF) communication receiver for carrier recovery of a modulated signal, such as an amplitude modulated (AM) signal. Such receivers may include radio and television receivers, although the scope of the present invention is not limited in this regard. More specifically, the re-configurable PLL can be used to conduct both wideband carrier acquisition and narrowband frequency tracking, and the PLL can be controlled to operate in a selected one of these two different modes. In one embodiment, the frequency acquisition mode, referred to as a mode "1", is used to perform frequency acquisition in a feedforward scheme, and the frequency tracking mode, referred to as a mode "0", is used to perform frequency tracking in a feedback scheme.

Figure 1:
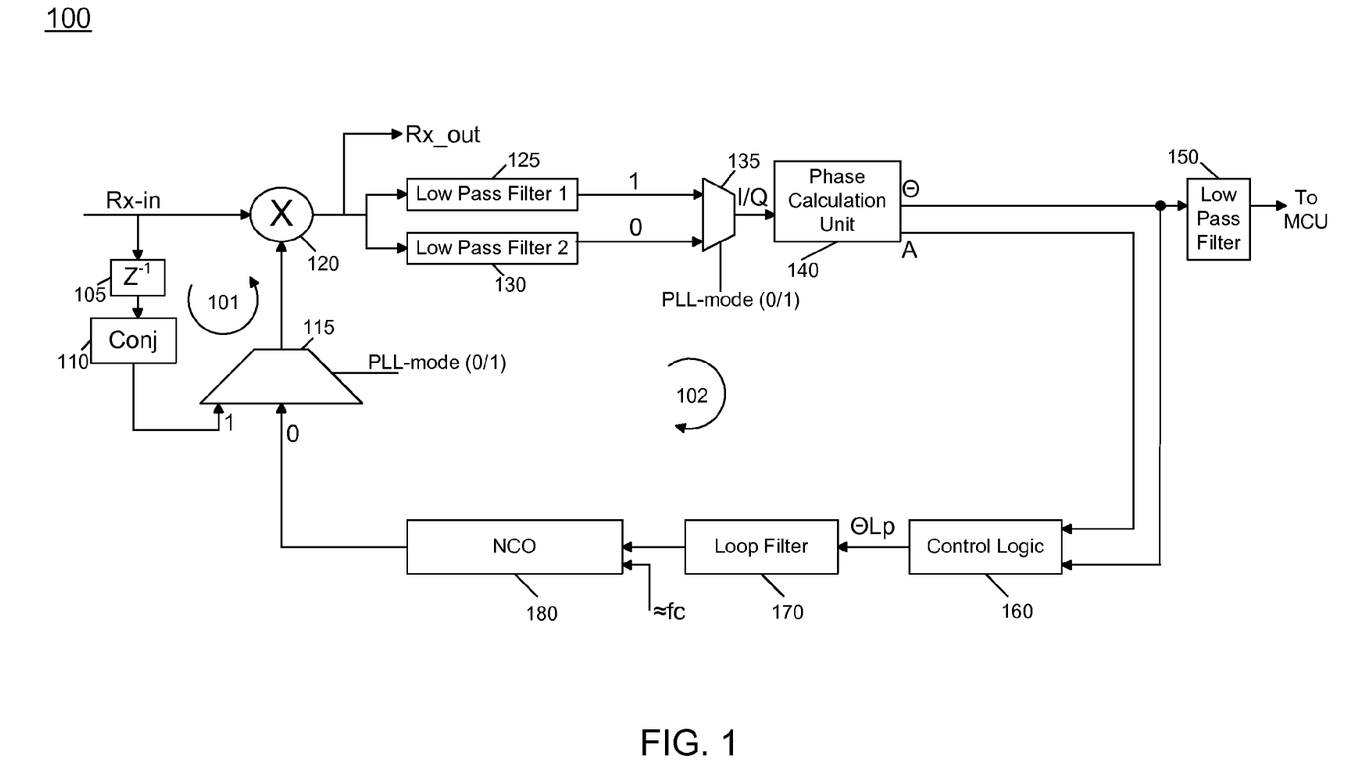
FIG. 1 is a block diagram of a configurable phase lock loop (PLL) in accordance with one embodiment of the present invention.

Referring now to FIG. 1, shown is a block diagram of a re-configurable PLL in accordance with one embodiment of the present invention. In one embodiment, the PLL may be part of a digital signal processor (DSP) that also performs demodulation. As shown in FIG. 1, PLL 100 may include two configurable signal paths, namely a feedforward path 101 and a feedback path 102. In various embodiments, feedforward path 101 may be used for frequency acquisition, while feedback path 102 may be used for frequency tracking. Thus in the embodiment of FIG. 1, the two paths are combined to share most of the hardware for frequency acquisition and tracking, which reduces hardware implementation cost. As seen, PLL 100 receives an incoming signal (Rx-in) which in one embodiment may be a low intermediate frequency (LIF) digital representation of a received signal, although the scope of the present invention is not limited in this regard. For example, in one implementation the DSP may be part of a single die semiconductor-based television tuner that is capable of receiving and processing both analog and digital television signals (ATV or DTV).

As seen, the input signal is provided to a multiplier 120, which in various embodiments may be a complex multiplier. In the frequency acquisition mode, with feedforward path 101 enabled and feedback path 102 disabled, the incoming signal is also provided to a delay element 105 which performs a one sample delay to its input signal, the output of which is provided to a conjugate operator 110, which performs a complex conjugate on the delayed sample. The complex conjugate function may act to generate a negative of the imaginary part of a complex signal, in other words a complex number $ae^{j\Theta}$ may be transformed into $ae^{-j\Theta}$. The output of complex conjugate operator 110 is provided to a selector 115, which in the embodiment shown may be a multiplexer controlled by a mode control signal. As seen, in mode 1, namely the frequency acquisition mode, this input to multiplexer 115 from conjugate operator 110 may be selected and fed to multiplier 120. Multiplier 120 combined with low pass filter 125 generates a correlation of the input signal and the delayed signal.

In turn, this correlation is provided to a low pass filter 125, which filters the correlated signal. In one embodiment, low pass filter 125 may be a very narrow passband low pass filter to estimate the mean by passing only low frequency information, which it provides to another selector 135, which again may be a multiplexer controlled by the same mode control signal. The choice of filter bandwidth can be made based on the frequency acquisition accuracy and speed requirement tradeoff in practical applications. An extremely narrow bandwidth filter could provide an accurate estimate of the filter input, but needs a larger time constant to converge.

The output of multiplexer 135, namely I/Q signals, is provided to a phase calculation circuit 140, which may generate amplitude and phase information (A and $\Theta$, respectively) from the incoming signals. In one embodiment, phase calculation circuit 140 may be implemented as a coordinate rotation digital computer (CORDIC) engine. For purposes of frequency acquisition, the phase information is provided to a low pass filter 150, which estimates the mean of the phase information. This filtered phase information, which in the acquisition mode is an estimate of the carrier frequency, is provided to control circuitry of the receiver (not shown in FIG. 1). In one embodiment, the control circuitry may be a microcontroller unit (MCU), which receives the carrier frequency estimate and sets the receiver up for normal operation using that estimate. As will be discussed further below, in various implementations the MCU may control analog front end and/or digital components to make appropriate frequency adjustments based on the frequency estimate to enable proper operation during the frequency tracking mode.

During the tracking mode, the feedforward path 101 is disabled and the feedback path 102 is activated by multiplexer input selection. Accordingly, the incoming signal is passed to multiplier 120, where it is multiplied with a feedback sine/cosine pair that corresponds substantially to the carrier frequency, such that the output from multiplier 120 may be provided to downstream circuitry of a demodulator as a baseband signal, Rx_out with the carrier frequency being translated to DC. In addition, to reduce the noise inside the phase lock loop, this signal may further be provided to low pass filter 130, which filters the signal and provides it to multiplexer 135, which during the tracking mode selects this output to be provided to phase calculation unit 140. In turn, the phase and amplitude information output from phase calculation unit 140 may be provided to a control logic 160, which may perform various processing on the amplitude and phase, as will be discussed further below.

After such processing, the processed phase information is provided to a loop filter 170, which filters the phase information and provides it to numerically controlled oscillator (NCO) 180. In one embodiment, NCO 180 may include a phase accumulator and a look up table which generates a sine/cosine pair to drive multiplexer 115 and in turn to multiplier 120, which acts to remove the carrier frequency from the incoming signal, thus translating the incoming signal to baseband. In one embodiment, the feedback value may have an exponential value of $e^{-j\omega_c t}$, where $\omega_c$ is estimated by the loop filter output. While shown with this particular implementation in the embodiment of FIG. 1, understand the scope of the present invention is not limited in this regard. While described as operating on low-IF signals in this implementation, the scope of the present invention is not limited in this regard. Note further that in some embodiments, low pass filter 125 and low pass filter 130 may be designed as a single filter with a programmable filter bandwidth and group delay.

Figure 2:
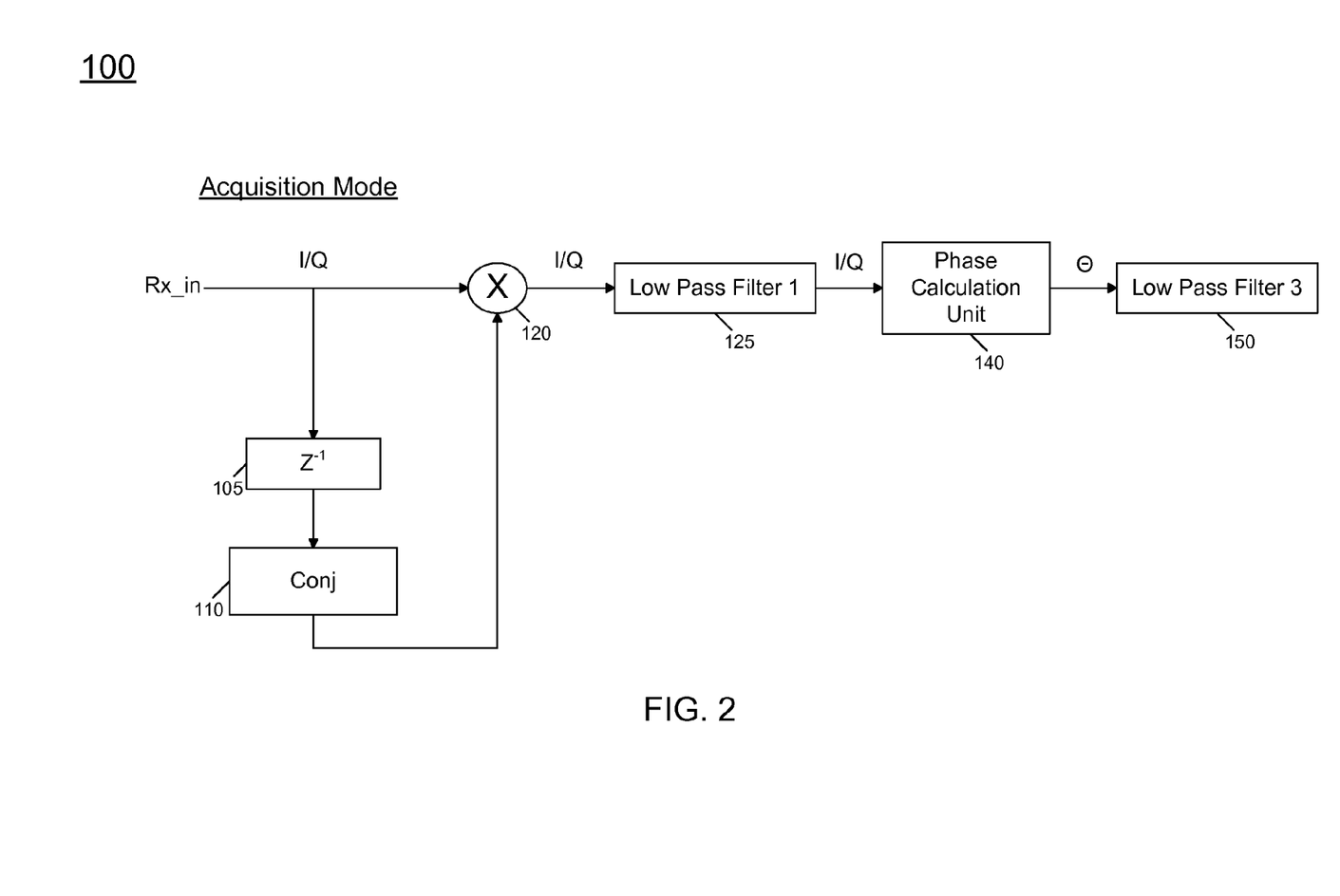
FIG. 2 is a block diagram of a PLL in a feedforward configuration in accordance with one embodiment of the present invention.

For ease of discussion, the configuration for feedforward configuration for frequency acquisition is shown in FIG. 2, which uses the same numbering scheme as FIG. 1. Here, the incoming signal, Rx_in(n), is $X(nT)\exp(j\omega_c nT)$, where $X(nT)$ is the message information, $\omega_c$ is the carrier frequency, and the T is the sample period. The output of delay unit 105, namely the delayed sample, Rx_in(n−1), is $X((n-1)T)\exp(j\omega_c(n-1)T)$. In turn, the conjugate of this signal, Rx*_in(n−1), output by conjugate function 110, is $X^*((n-1)T)\exp(-j\omega_c(n-1)T)$. The output of complex multiplier 120 is $X(nT)\exp(j\omega_c nT)X^*((n-1)T)\exp(-j\omega_c(n-1)T)=X(nT)X^*((n-1)T)\exp(j\omega_c T)$. Thus the output of low pass filter (of LPF 125) is approximately $Rxx(T)\exp(j\omega_c T)$.

Note that when the sample rate is high enough or the sample period T is small enough compared to incoming signal bandwidth, $Rxx(T)$ may be approximated as $Rxx(0)$, which is a real valued number. Thus the phase of the complex signal $Rxx(0)\exp(j\omega_c T)$ at the low pass filter output (of LPF 125) contains the carrier frequency information, $\omega_c$. Phase calculation unit 140 thus can calculate the phase of the input I/Q signal. Feeding $Rxx(T)\exp(j\omega_c T)$ to the phase calculation unit, the output phase $\Theta$ is $\omega_c T$. In one embodiment, low pass filter 150 is a very narrow band filter. With a noisy instantaneous phase estimate $\Theta$ as the input, the filtered phase is a relatively accurate estimation of the carrier frequency. In general, the bandwidth of low pass filter 125 and low pass filter 150 may be set so that the carrier frequency estimation error is less than the lock-in range of the PLL in feedback mode.

Figure 3:
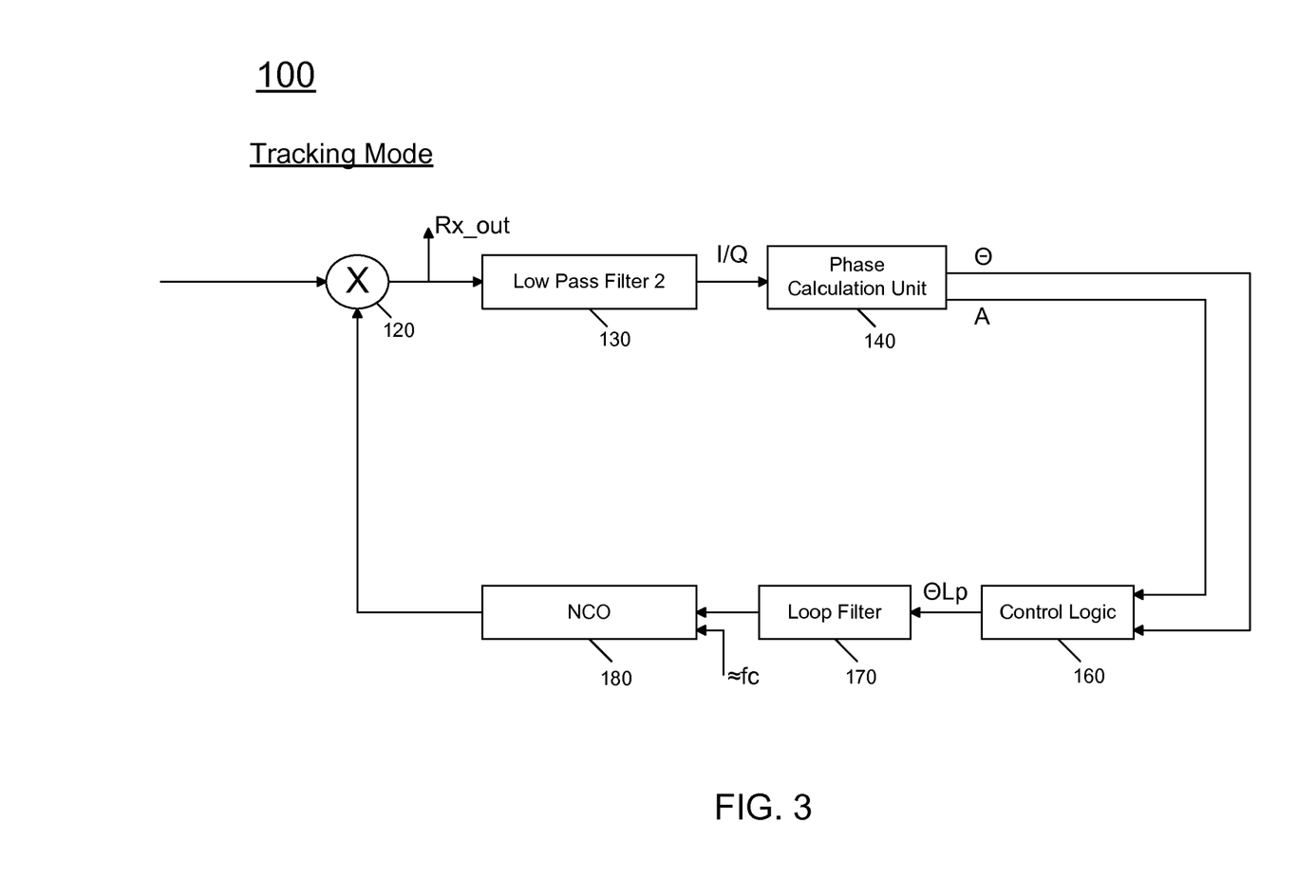
FIG. 3 is a block diagram of a PLL in a feedback loop configuration in accordance with one embodiment of the present invention.

Referring now to FIG. 3, shown for ease of illustration is the feedback configuration for the re-configurable PLL during frequency tracking mode. As seen, in the tracking mode, PLL 100 includes complex multiplier 120, low pass filter 130, phase calculation unit 140, control logic 160, loop filter 170, and numerically controlled oscillator (NCO) 180, which in one embodiment may be a phase accumulator cascaded with a sine/cosine look up table.

Figure 4:
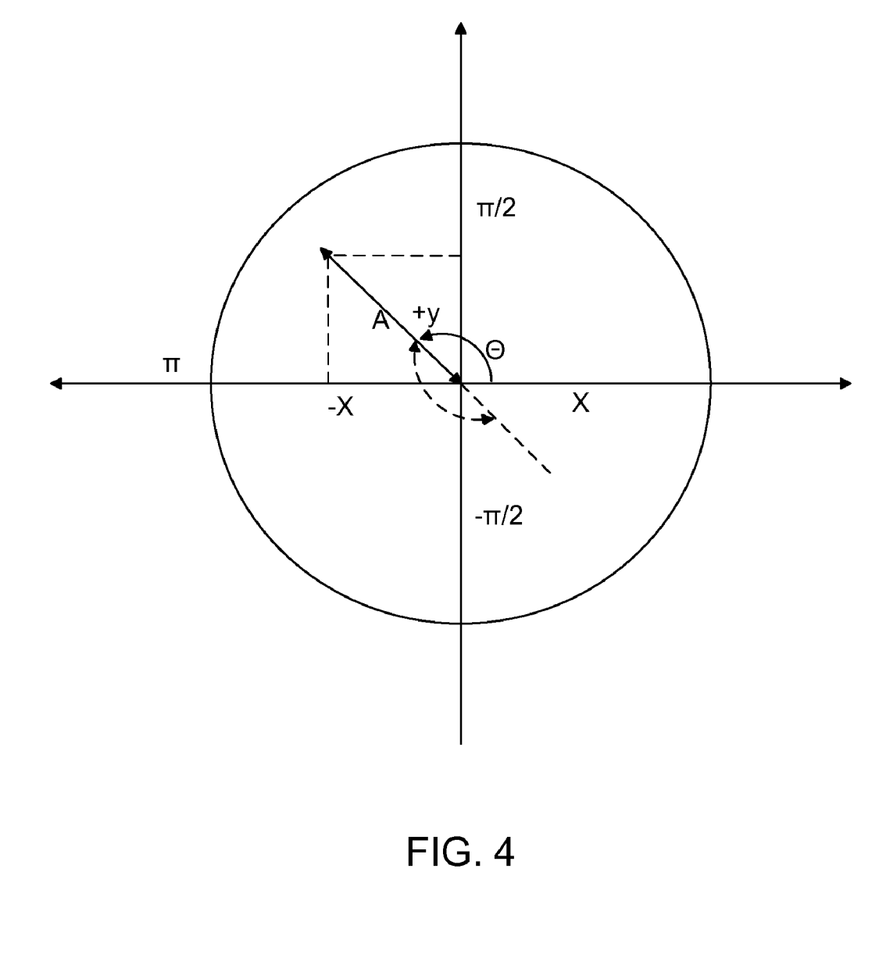
FIG. 4 is a block diagram of a unit circle in accordance with one embodiment of the present invention.

Phase calculation unit 140 operates to receive complex inputs Xi+jXq and output rms amplitude ($A=\sqrt{x^2+y^2}$) and phase ($\Theta=a\tan 2(y,x)$) values, where a tan 2(y, x) is defined as the radian angle of the (x, y) pair on the complex plane over a range of 0 to $2\pi$ spanning the whole unit circle in FIG. 4. Control logic 160 takes the phase calculation outputs A and $\Theta$ to make decision on the phase $\Theta_{LP}$ that drives loop filter 170. The control logic 160 which may be implemented in hardware, software, firmware, or a combination, drives the loop filter using a processed phase value.

The phase calculation unit produces a phase value that is fundamentally modulo-$2\pi$ in nature, meaning that there will be some discontinuity in the phase output around certain angles on the complex plane. The location of the discontinuity on the complex plane can be strategically selected so as to optimize performance of the receiver with respect to transmission impairments such as overmodulation. For example, a numbering system can be selected so that the calculated phase range is (0, $2\pi$) or ($-\pi$, $\pi$) resulting in the discontinuity occurring at different locations on the complex plane. Considering an expected operation point around 0, placing the discontinuity at $+/-\pi$ provides greatest noise immunity. As seen, when x is positive the (x, y) pair is on the right side of the complex plane, and $\Theta$ varies from $-\pi/2$ to $\pi/2$.

The impairment of overmodulation can result in discontinuities in the detected phase for two distinct causes, the first being continued operation near the +/−pi discontinuity in the phase calculation unit output range and the second being transition of the input signal into or out of the overmodulated condition. After PLL locking, the phase error $\Theta$ converges toward zero where the resultant phase has no discontinuity and, thus x is positive and y≈0. In the case of overmodulation after locking, x becomes negative, and the calculated phase is near the phase discontinuity at $+/-\pi$. In this case, the detected phase may report a phase discontinuity, as one calculation sample results in a detected phase near $+\pi$ and the next sample possibly results in a detected phase near $-\pi$, depending on the polarity of the y component of the (x, y) pair. This large discontinuity might destabilize the PLL. The second phase discontinuity can occur as the signal enters or exits the overmodulated condition in the locked state. In this case, the y component of the input pair remains near zero and the x component transitions from a positive value to a negative value (or vice-versa). The detected phase will thus change by a value of $\pi$ between consecutive samples, which a gain threatens to destabilize the loop.

Figure 5:
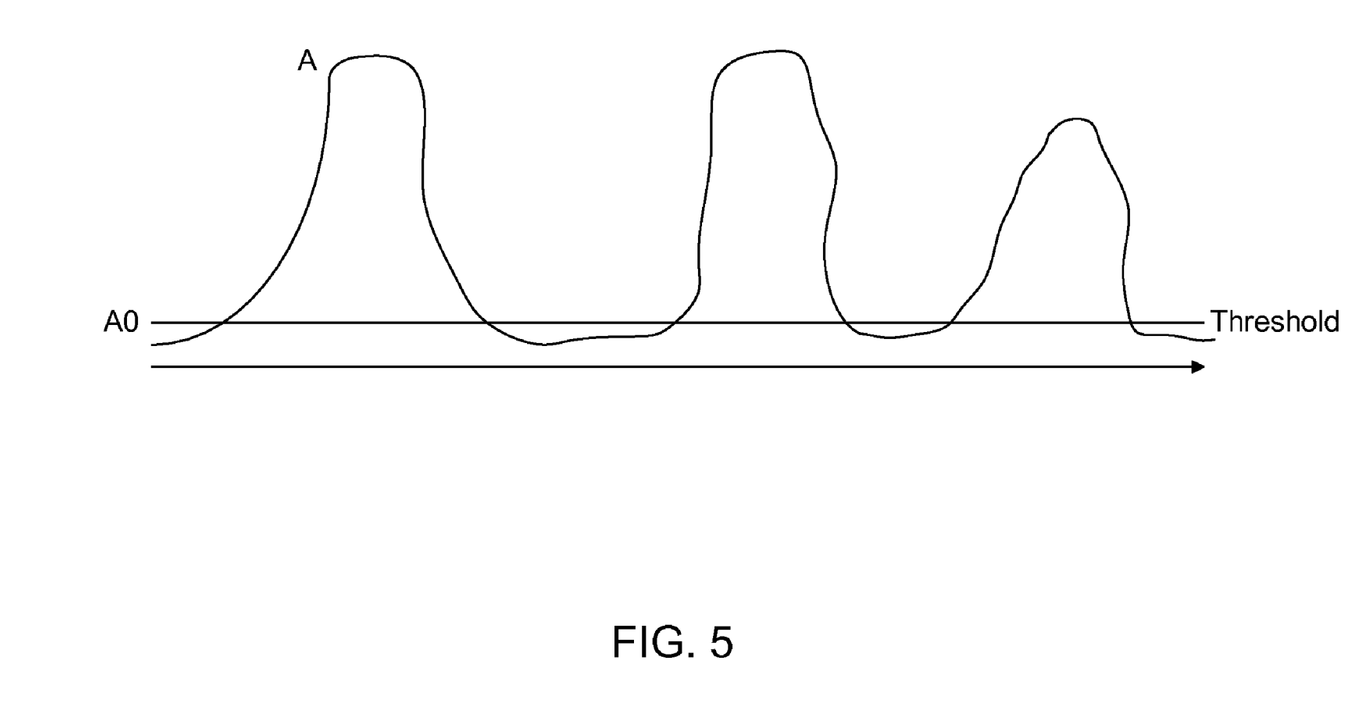
FIG. 5 is a graphical illustration of a varying input signal and a threshold signal.

Hence, control logic 160 may act to process the received phase information to allow overmodulation tolerance, by properly handling the two types of phase discontinuity, based on the amplitude information. In one embodiment, control logic 160 may operate to compare the input amplitude value A to a threshold, A0. FIG. 5 is a graphical illustration showing the variation in this amplitude over time, and further including the threshold A0, which may be either fixed or programmable to allow different overmodulation depth tolerance depending on application requirement.

In one implementation, if A>A0, $\Theta_{LP}$ is mapped directly to $\Theta$ unchanged, otherwise $\Theta_{LP}$ is mapped to an adjusted value according to a predetermined adjustment scheme. More specifically, when A is less than A0, in one embodiment $\Theta$ may be mapped into the range between ($-\pi/2$, $\pi/2$) strictly on the right side of the complex plane (shown in FIG. 4) by adjusting $\Theta$ by $+/-\pi$ radians to realize the adjustment. By doing this mapping operation and providing an adjusted phase, the phase discontinuities due to either cause are eliminated, and will not cause PLL instability. Examples of the mapping function are shown below:

$$map(\pi/4)=\pi/4$$

$$map(-\pi/4)=-\pi/4$$

$$map(3\pi/4)=-\pi/4$$

$$map(-3\pi/4)=\pi/4$$

Thus as seen, detected phase values in the range of $-\pi/2$ to $\pi/2$ stay un-mapped, while values outside this range are mapped to this $-\pi/2$ to $\pi/2$ range. That is, in general, for the feedback loop to be stable, the detected phase error should have no discontinuities and its mean should converge toward zero for the loop to settle. However, when the transmit signal is overmodulated, a $+/-\pi$ radians discontinuity in the detected phase can result, creating loop instability. Thus, control logic 160 may act to map the phase calculation unit phase output when overmodulation is present. The overmodulation depth tolerance enabled using the control logic depends on the choice of amplitude threshold (A0) for comparison to the output rms amplitude A, described above. For example, if A0 is chosen to be 20% of the maximum signal level, then the PLL could tolerate 120% of modulation depth.

Figure 6:
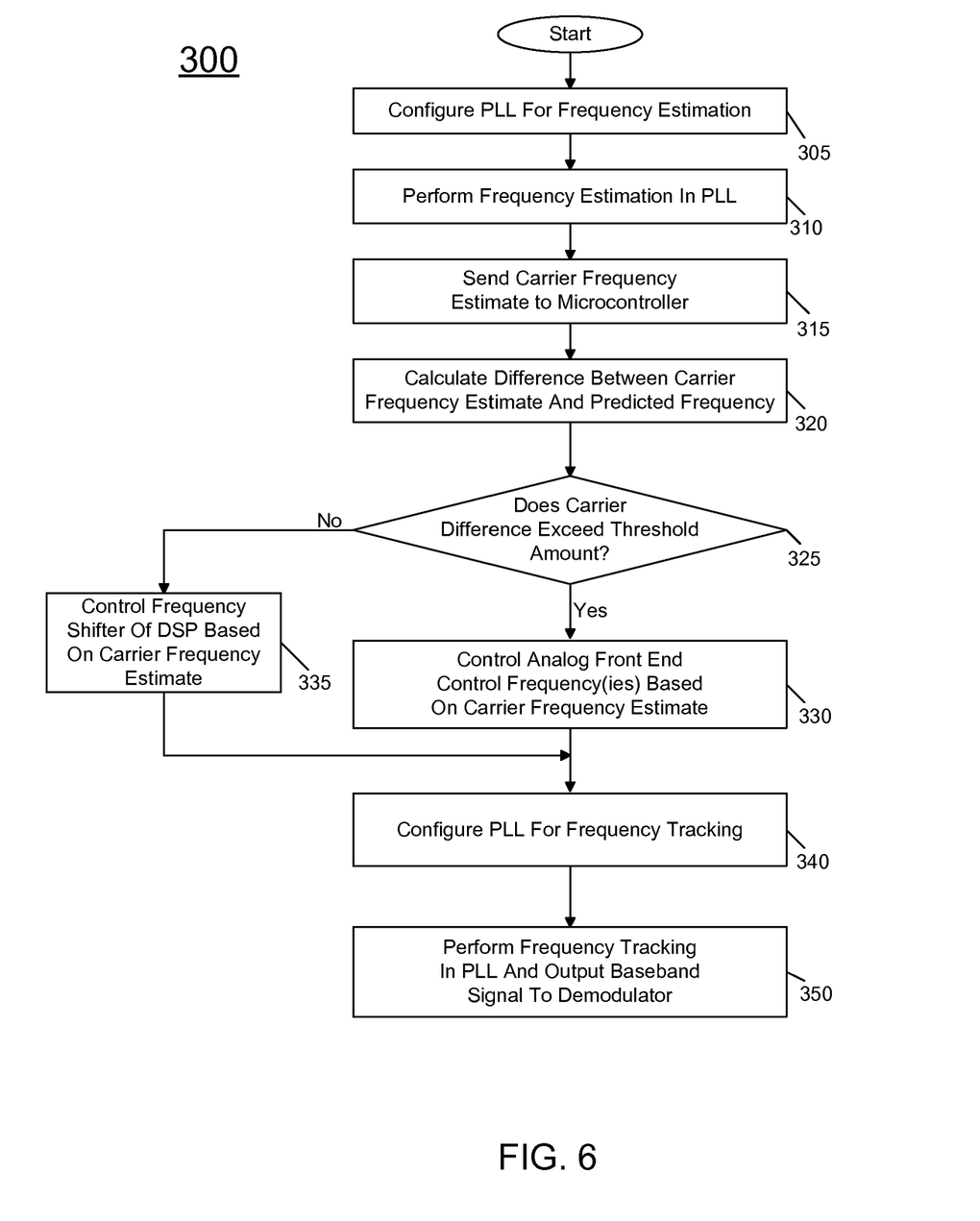
FIG. 6 is a flow diagram of a method in accordance with one embodiment of the present invention.

Referring now to FIG. 6, shown is a flow diagram of a method in accordance with one embodiment of the present invention. Method 300 may be used to reconfigure the PLL to operate in both frequency estimation and frequency tracking modes and to further control the receiver to operate to translate in frequency an incoming signal based on a carrier frequency estimation determined in the frequency estimation mode.

As seen in FIG. 6, method 300 may begin by configuring the PLL into frequency estimator mode (block 305). The frequency estimation mode may be entered in response to a host device request to tune to an assigned channel, which has a pre-determined frequency. This pre-determined frequency could either be stored in a look up table (LUT) that a microcontroller or control circuit could access, or may be calculated based on a standard frequency plan. In many cases the pre-determined frequency is different from the actual carrier frequency. The difference could be easily larger than the feedback configuration PLL's lock-in range. As discussed above, using a reconfigurable PLL in accordance with an embodiment of the present invention, a microcontroller or other logic can instruct the PLL to be set up in the feedforward configuration to behave as a frequency estimator. Then at block 310, frequency estimation may be performed to acquire an estimate of carrier frequency. This frequency estimate is provided to a microcontroller or other control logic (block 315).

Then at block 320, the microcontroller may calculate the difference between the carrier frequency estimate and the predetermined carrier frequency for the assigned channel. This difference is used by the microcontroller to control analog front-end portion or digital portion. Then the microcontroller may determine whether the difference between the carrier frequency estimate and the predetermined carrier frequency for the selected channel exceeds a threshold amount, which can be a configurable threshold that is set by characterization of receiver performance as a function of the frequency offset (diamond 325). That is, due to various transmission signal impairments, as well as impairments inherent in the receiver (particularly in the analog front end), the difference between the carrier frequency estimate and the predetermined carrier frequency may exceed this threshold. If so, control passes to block 330. At block 330, the analog front end may be controlled. More specifically, the microcontroller may instruct the analog front end to adjust its downconversion frequency based on the carrier frequency estimate. For example, a mixing signal of the front end mixer may be adjusted based on the carrier frequency estimate. Also, at the conclusion of the acquisition mode, the microcontroller may configure the PLL for frequency tracking (block 340). Control then passes to block 350, where frequency tracking may be performed in the PLL and the PLL may output a baseband signal that is provided for demodulation.

Referring back to diamond 325, if the carrier frequency estimate is sufficiently close to the predetermined carrier frequency, namely the difference is less than the threshold amount, control passes instead to block 335. There, rather than controlling analog front end components, a frequency shifter of a DSP that includes the PLL may be controlled to thus shift the incoming frequency to an appropriate range based on the carrier frequency estimate. Of course, if the carrier frequency estimate is close enough to the raw frequency estimate, no adjustments may need to be made at all. Control then passes to block 340, discussed above. While shown with this particular implementation in the embodiment of FIG. 6, the scope of the present invention is not limited in this regard.

Embodiments can be implemented in many different receiver architectures. Some embodiments can be incorporated in a single-chip semiconductor receiver that includes analog circuitry and digital circuitry including a DSP. Components within the DSP may compensate for non-idealities in the receiver, thereby allowing optimizations to improve any of several desirable tuner characteristics, including performance, power consumption, die area, and implementation in, e.g., a complementary metal-oxide-semiconductor (CMOS) silicon process. Thus impairments occurring in analog circuitry of the tuner can be compensated for in the DSP. In some embodiments, the DSP can operate with a LIF or ZIF tuner, and can handle processing of signals of all world-wide analog TV standards.

Components of the DSP can be connected in such a way as to optimize performance for analog television under normal and impaired signal conditions, including overmodulation of the signal using a PLL in accordance with an embodiment of the present invention. Still further, components of the DSP can be reconfigured under microcontroller control to provide signal processing appropriate for digital television standards with extremely low overhead cost.

Figure 7:
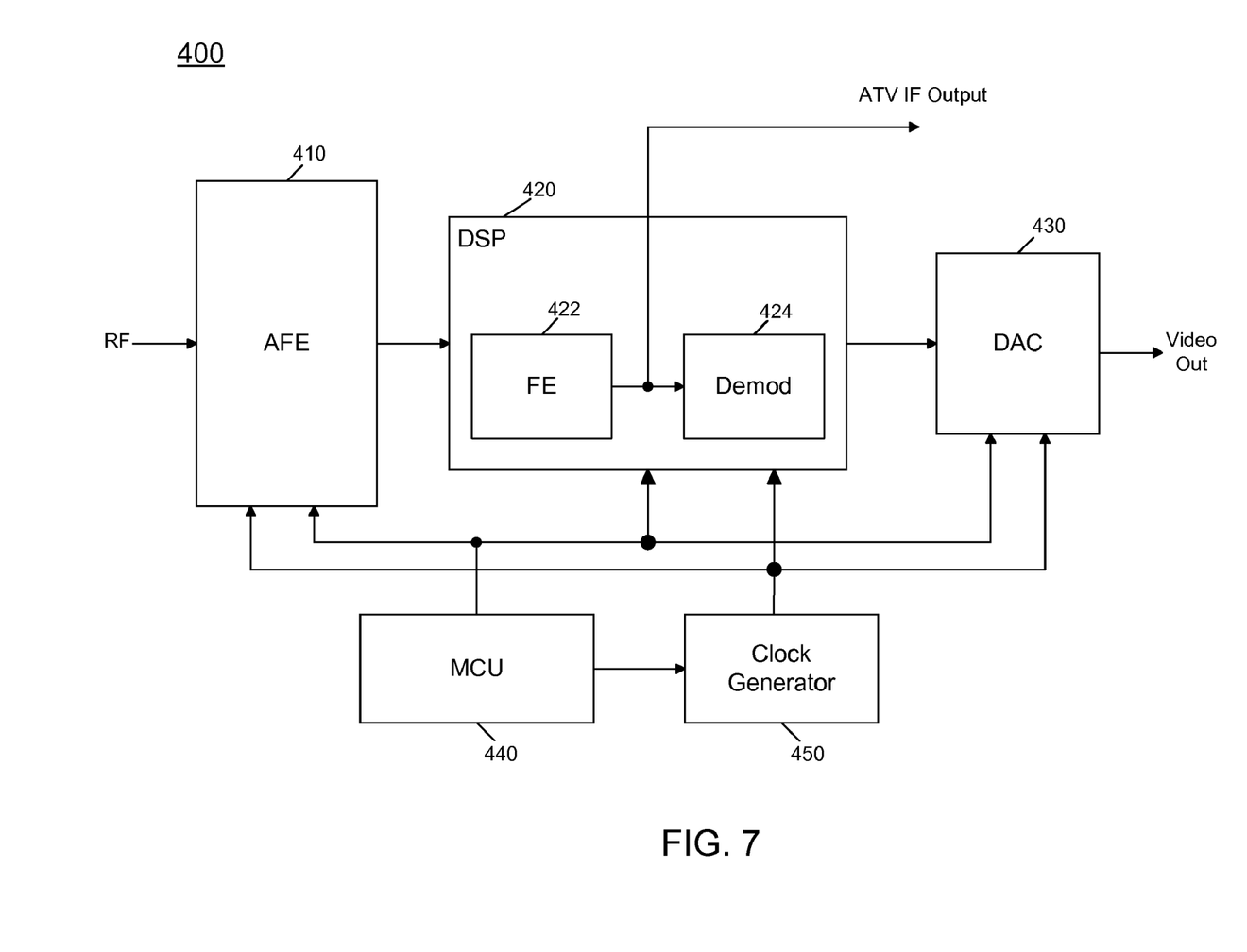
FIG. 7 is a block diagram of a television tuner/demodulator in accordance with one embodiment of the present invention.

Referring now to FIG. 7, shown is a block diagram of a television tuner/demodulator in accordance with one embodiment of the present invention. As shown in FIG. 7, the tuner/demodulator may be implemented as a single chip integrated circuit (IC) 400, which may be implemented on a single semiconductor die including both analog and digital circuitry, in one embodiment. In the embodiment of FIG. 7, incoming radio frequency (RF) signals are provided to an analog front end (AFE) 410, which may include various components such as a low noise amplifier (LNA) to provide variable gain based on a gain control signal of a microcontroller unit (MCU) 440. The AFE may further include one or more filters and mixers, which may downconvert the signals, also under control of MCU 440, to, e.g., low IF or zero IF complex signals. AFE 410 may further include additional IF amplifier circuitry and a digitizer such as an analog-to-digital converter (ADC). These digitized I and Q values may be provided to a digital portion of IC 400, namely a DSP 420 that includes various functionality, and which may be generally separated into a digital front end 422 and a demodulator 424.

As described above, the analog and digital blocks may be operated under control of MCU 440. In this regard, MCU 440 may perform various calibrations, provide for control of AGC functions and control a clock generator 450. Clock generator 450 may generate digital clocks to control operation of the various components at different frequencies depending upon the frequency of an incoming selected channel, to reduce harmonics and sub-harmonics of digital clocks that may interfere with RF reception.

In one embodiment, digital front end 422 may perform various functions, including decimation, channel filtering, and ZIF AGC. After such processing, digital front end 422 may provide a ZIF signal to demodulator 424 which may perform analog TV demodulation in a system that is receiving ATV signals.

In various embodiments, demodulator 424 may perform functions including a demodulation to baseband using a FPLL in accordance with an embodiment of the present invention, Nyquist filtering, video filtering, group-delay correction, and baseband (CVBS) AGC. While shown with this particular implementation in the embodiment of FIG. 7, understand the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
 a phase lock loop (PLL) having an input to receive an incoming signal and to translate the incoming signal to a baseband signal, the PLL including:
  a feedforward path coupled between the input of the PLL and an input of a multiplier of the PLL to operate in a carrier frequency acquisition mode to obtain a carrier frequency estimate and to provide the carrier frequency estimate to a controller; and
  a feedback loop path coupled between an output of the multiplier and an input of the multiplier to operate in a carrier frequency tracking mode to translate the incoming signal to the baseband signal.

2. The apparatus of claim 1, wherein the PLL is re-configurable under control of the controller to operate in a feedforward configuration for the carrier frequency acquisition mode.

3. The apparatus of claim 1, wherein the PLL is re-configurable under control of the controller to operate in a feedback loop configuration for the carrier frequency tracking mode.

4. The apparatus of claim 1, wherein the feedforward path includes:
 a delay element to receive the incoming signal and to output a delayed sample;
 a conjugate function to generate a conjugate of the delayed sample;

the multiplier to generate a correlation between the incoming signal and the delayed sample conjugate;
a first filter to filter the correlation;
a phase calculation engine to generate a phase value from the filtered correlation; and
a second filter to filter the phase value to obtain the carrier frequency estimate.

5. The apparatus of claim 1, wherein the feedback loop path includes:
the multiplier to multiply the incoming signal and a feedback signal to obtain the baseband signal;
a third filter to filter the baseband signal;
a phase calculation engine to generate an amplitude value and a phase value from the filtered baseband signal;
a control logic to determine whether to re-map the phase value based on the amplitude value;
a loop filter to filter the phase value;
a numerical controlled oscillator (NCO) to generate a sine/cosine pair based on the loop filter output.

6. The apparatus of claim 5, wherein the control logic is to re-map the phase value to within a range of between $-\pi/2$ and $\pi/2$, the range including a zero value, if the amplitude value is greater than a predetermined threshold so that a target overmodulation depth is supported by the PLL.

7. The apparatus of claim 5, wherein the control logic is to re-map the phase value if the incoming signal is overmodulated.

8. The apparatus of claim 1, wherein the PLL is of a digital portion of a semiconductor receiver further including an analog front end, the digital portion including the controller, and wherein the controller is to control the analog front end and a digital front end based on the carrier frequency estimate.

9. A television tuner comprising:
an analog front end to receive and downconvert a radio frequency (RF) signal to an intermediate frequency (IF) signal, and an analog-to-digital converter (ADC) to convert an analog signal into a digital signal;
a digital signal processor (DSP) coupled to the analog front end and including a digital front end to perform a set of functions on the digital signal including frequency translation from the IF signal to a zero intermediate frequency (ZIF) signal, the DSP further including a demodulator having a phase lock loop (PLL) to translate the ZIF signal to a baseband signal, the PLL including a feed-forward configuration to operate in a carrier frequency acquisition mode to obtain a carrier frequency estimate and to provide the carrier frequency estimate to a controller and a feedback loop configuration to operate in a carrier frequency tracking mode to translate the ZIF signal to the baseband signal and including a control logic to allow operation in the existence of overmodulation; and
the controller coupled to the DSP to configure the PLL to operate in the carrier frequency acquisition mode and the carrier frequency tracking mode.

10. The television tuner of claim 9, wherein the controller is to cause at least one of the analog front end and the DSP to adjust at least one control frequency based on the carrier frequency estimate.

11. The television tuner of claim 9, wherein the PLL is to generate a phase value and an amplitude value from a filtered output of a multiplier of the PLL that multiplies the ZIF signal with a feedback value.

12. The television tuner of claim 11, wherein the control logic is to re-map the phase value to allow proper operation in the existence of overmodulation.

13. The television tuner of claim 12, wherein the control logic is to re-map the phase value to a range of between $-\pi/2$ and $\pi/2$, the range including a zero value, if the amplitude value is greater than a predetermined threshold.

14. The television tuner of claim 9, wherein the television tuner is formed on a single semiconductor die including the analog front end, the DSP, and the controller.

15. A method comprising:
processing a request in a receiver to tune to an assigned channel, the assigned channel having a carrier frequency and to be received in the receiver as a radio frequency (RF) signal;
configuring a re-configurable phase lock loop (PLL) of the receiver operable in a frequency estimation mode and a frequency/phase tracking mode;
obtaining a frequency estimate of the carrier frequency in the re-configurable PLL during the frequency estimation mode;
providing the frequency estimate to a controller of the receiver;
determining a difference between the frequency estimate and a predicted frequency for the assigned channel; and
controlling an analog front end of the receiver for a frequency shift based on the difference.

16. The method of claim 15, further comprising comparing the difference to a threshold and controlling the analog front end if the difference is greater than the threshold, and instead controlling a digital portion of the receiver if the difference is less than the threshold.

17. The method of claim 16, further comprising configuring the re-configurable PLL for the frequency/phase tracking mode after providing the frequency estimate to the controller.

18. The method of claim 17, further comprising thereafter performing frequency tracking in the re-configurable PLL and outputting a baseband signal from the re-configurable PLL to a demodulator of the receiver.

* * * * *